(12) United States Patent
Pan et al.

(10) Patent No.: US 7,078,278 B2
(45) Date of Patent: Jul. 18, 2006

(54) DUAL-METAL CMOS TRANSISTORS WITH TUNABLE GATE ELECTRODE WORK FUNCTION AND METHOD OF MAKING THE SAME

(75) Inventors: James Pan, Fishkill, NY (US); Ming-Ren Lin, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/833,073

(22) Filed: Apr. 28, 2004

(65) Prior Publication Data

US 2005/0245016 A1    Nov. 3, 2005

(51) Int. Cl.
*H01L 28/80*    (2006.01)
(52) U.S. Cl. ............ 438/153; 438/412; 438/223; 438/224
(58) Field of Classification Search ............ 257/274, 257/371; 438/223–228
See application file for complete search history.

(56) References Cited

U.S. PATENT DOCUMENTS

| | | | |
|---|---|---|---|
| 6,080,648 A | 6/2000 | Nagashima | |
| 6,376,888 B1 | 4/2002 | Tsunashima et al. | |
| 6,475,908 B1 | 11/2002 | Lin et al. | |
| 6,703,271 B1 * | 3/2004 | Yeo et al. | 438/221 |
| 6,740,939 B1 * | 5/2004 | Sayama et al. | 257/371 |
| 6,835,639 B1 * | 12/2004 | Rotondaro et al. | 438/592 |
| 2001/0027005 A1 | 10/2001 | Moriwaki et al. | |
| 2002/0079548 A1 | 6/2002 | Hu | |
| 2004/0063285 A1 | 4/2004 | Pham et al. | |

FOREIGN PATENT DOCUMENTS

WO        WO 92/06505        4/1992

OTHER PUBLICATIONS

"Work Function Criteria", NC State University, Raleigh, NC, Bei Chen et al, Oct. 28, 2003.*

* cited by examiner

*Primary Examiner*—Fetsum Abraham

(57) ABSTRACT

A dual-metal CMOS arrangement and method of making the same provides a substrate and a plurality of NMOS devices and PMOS devices formed on the substrate. Each of the plurality of NMOS devices and PMOS devices have gate electrodes. Each NMOS gate electrode includes a first silicide region on the substrate and a first metal region on the first silicide region. The first silicide region of the NMOS gate electrode consists of a first silicide having a work function that is close to the conduction band of silicon. Each of the PMOS gate electrodes includes a second silicide region on the substrate and a second metal region on the second silicide region. The second silicide region of the PMOS gate electrode consists of a second silicide having a work function that is close to the valence band of silicon.

10 Claims, 17 Drawing Sheets

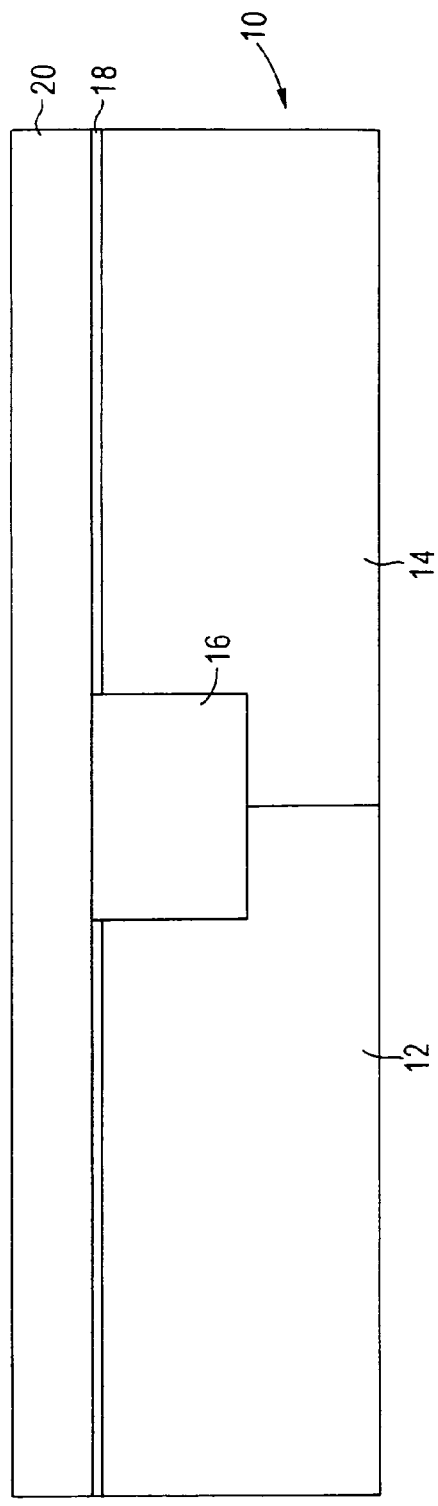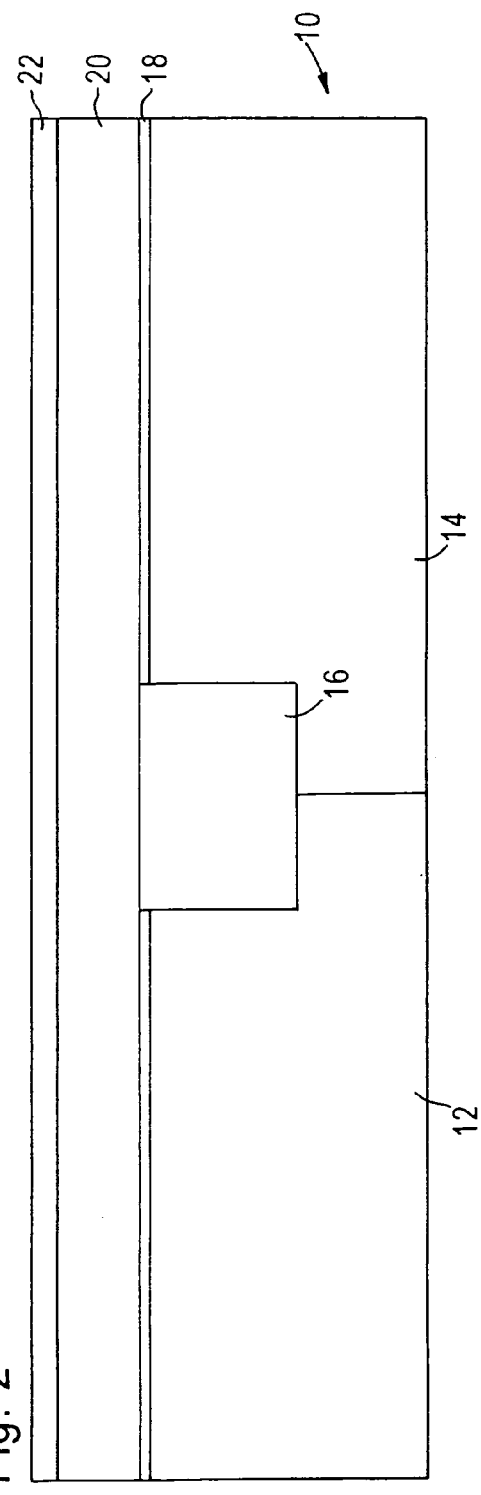

DUAL-METAL CMOS TRANSISTORS WITH TUNABLE GATE ELECTRODE WORK FUNCTION AND METHOD OF MAKING THE SAME

FIELD OF THE INVENTION

The present invention relates to the field of semiconductor fabrication, and more particularly, to a fabrication process incorporating different gate metals for NMOS and PMOS devices.

BACKGROUND OF THE INVENTION

In the semiconductor industry, it is normally desirable to fabricate NMOS (N-type metal oxide semiconductors) and PMOS (P-type metal oxide semiconductor) devices with matching threshold voltages. In conventional semiconductor processing, the NMOS and PMOS threshold voltages are conventionally adjusted by a combination of channel implants and selective doping of a polysilicon gate. It is generally effective in adjusting the threshold voltages for PMOS devices but less effective for NMOS devices. To overcome these problems, dual metal gate CMOS (complementary MOS) transistors have been provided, with the metals forming the gates being selected based on their work functions.

Traditional metal gate transistors are normally fabricated by dry etching of metal or metal capped with polysilicon, to form the gate. Dry etching of metal is extremely challenging, as it is difficult to ensure that the metal dry etch stops properly on the ultra-thin gate dielectric, such as a gate oxide. This failure to stop the dry etch on the gate oxide results in the loss of silicon in source/drain areas, thereby causing increased leakage current.

These problems encountered in forming metal gate transistors are exacerbated when attempting to implement dual metal gate CMOS arrangements. As stated above, such metal dual metal gate CMOS arrangements are desirable to adjust the work function and the threshold voltages. However, the traditional approach for forming metal gate transistors is not readily applicable to forming dual metal gate CMOS transistors.

It has proven desirable to provide fully silicided gates in order to suppress the drive current lost to polysilicon depletion effects. However, in providing fully silicided gate electrodes to suppress the drive current, the work function for one of the conductivity type devices will be undesirably changed. For example, providing full silicidation of the polysilicon gate electrodes of NMOS devices and PMOS devices will operate to suppress the drive current lost to polysilicon depletion effects. However, although the gate electrode for the NMOS devices will have a desirable work function, the gate electrodes for the PMOS devices will have an undesirable work function. This concern limits the usefulness of fully siliciding the gate electrodes of both NMOS and PMOS devices in a semiconductor arrangement.

Furthermore, there are other concerns with fully silicided gates. These include the non-uniformity of the silicidation, and the potential for making the gate oxide dielectric layer unreliable. For example, over-silicidation will stress the gate oxide dielectric material, to the detriment of the reliability of the overall device.

SUMMARY OF THE INVENTION

There is a need for a dual-metal CMOS arrangement in which the work function of the gate electrodes are tunable, without using a fully silicided gate electrode and their attendant problems.

This and other needs are meet by embodiments of the present invention which provide a dual-metal CMOS arrangement comprising a substrate and a plurality of NMOS devices and a plurality of PMOS devices. The plurality of NMOS devices have gate electrodes, with each NMOS gate electrode including a first silicide region on the substrate and a first metal region on the first silicide region. The first silicide region of the NMOS gate electrode consists of a first silicide having a work function within +/−0.2V of the conduction band of silicon. The plurality of PMOS devices have gate electrodes, with each PMOS gate electrode having a second silicide region on the substrate and a second metal region on the second silicide region. The second silicide region of the PMOS gate electrode consists of a second silicide having a work function within +/−0.2V of the valence band of silicon.

The other stated needs are also met by other aspects of the present invention which provide a method of forming a dual-metal CMOS arrangement, comprising the steps of forming silicon regions on gate dielectrics to form gate electrodes in NMOS device regions and in PMOS device regions. The silicon regions are converted to a first silicide region in the NMOS device regions and to a second silicide region in the PMOS device regions. The first silicide region consists of a first silicide having a work function within +/−0.2V of the conduction band of silicon and the second silicide region consists of a second silicide having a work function that is within +/−0.2V of the valence band of silicon.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 1 is a schematic cross-sectional view of a semiconductor wafer during one phase of manufacture of dual-metal CMOS transistors in accordance with the present invention.

FIG. 2 depicts the structure of FIG. 1 following the formation of an etch stop layer on a first silicon layer in accordance with certain embodiments of the present invention.

DETAILED DESCRIPTION OF THE INVENTION

Figure 3:
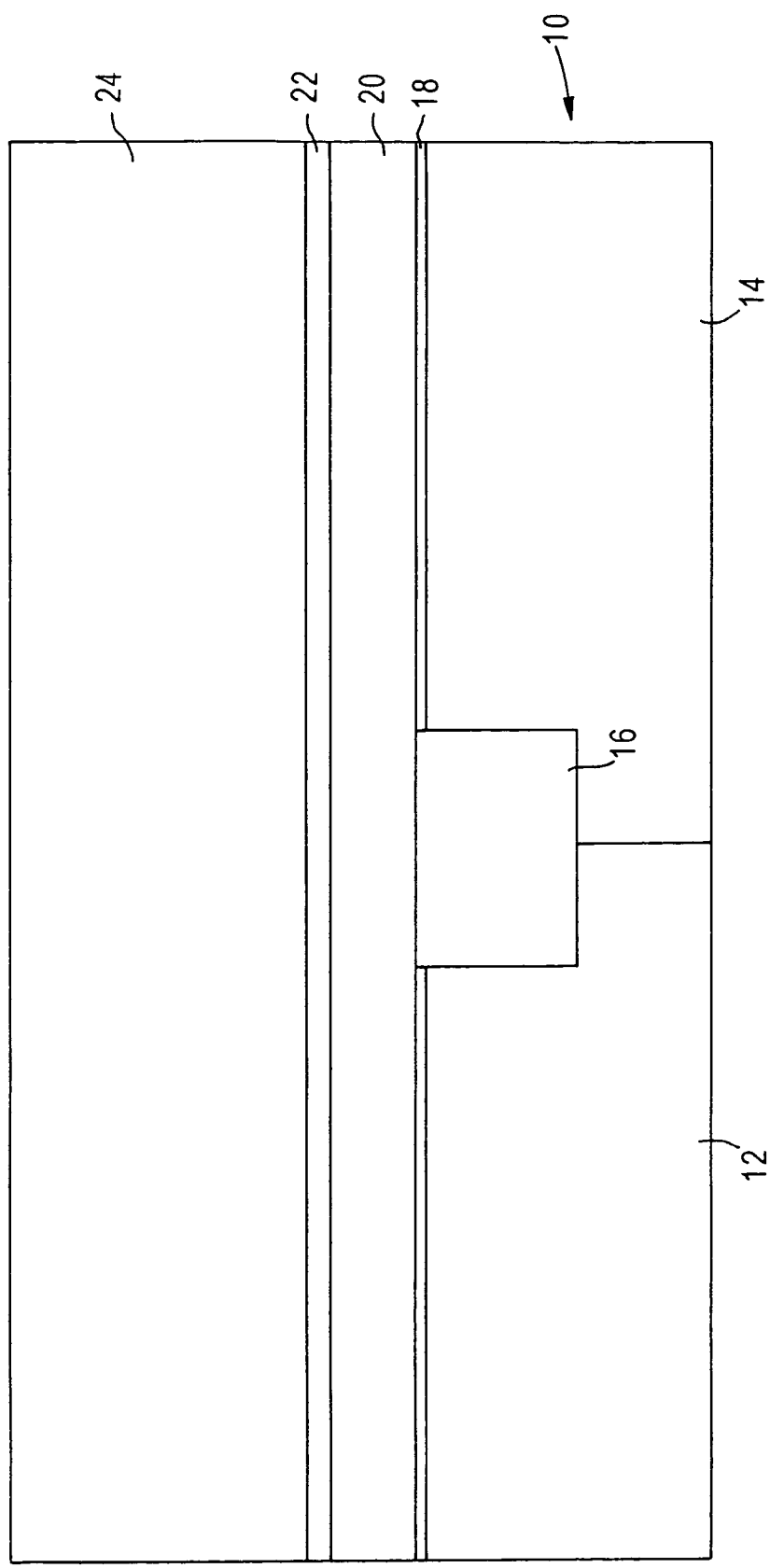
FIG. 3 depicts the structure of FIG. 2 following the deposition of a second silicon layer in accordance with embodiments of the present invention.

The present invention addresses and solves problems related to the formation of dual-metal CMOS transistors, and in particular, to those problems associated with fully silicided gate electrodes, including those related to non-uniformity of silicidation and gate oxide reliability. In certain aspects of the invention, the dual-metal CMOS arrangement is provided with a plurality of NMOS devices and PMOS devices that have gate electrodes. Each NMOS gate electrode includes a first silicide region on the substrate and a first metal region on the first silicide region. The first silicide region of the NMOS gate electrode consists of a first silicide having a work function within +/−0.2 V of the conduction band of silicon. Each PMOS gate electrode includes a second silicide region on the substrate and a second metal region on the second silicide region. The second silicide regions of the PMOS gate electrodes consist of a second silicide having a work function within +/−0.2 V of the valence band of silicon. Hence, each gate electrode is only partially silicided, and the silicide regions are respectively provided with silicide that is tunable to be compatible with the NMOS and PMOS type devices. In certain embodiments, the tuning of the work function is achieved employing two different kinds of metals, such as the silicide regions are formed with two different metal silicides having different work functions. In other embodiments, the silicide thickness is precisely adjusted to achieve certain silicide phases, thereby affecting the work function of these silicides for the respective NMOS and PMOS type devices.

FIG. 1 depicts a cross-sectional view of a portion of a semiconductor wafer during one stage of a semiconductor manufacturing process according to embodiments of the present invention. A partially completed semiconductor device is illustrated in FIG. 1. The device includes a substrate 10 formed of silicon, for example. Substrate 10 includes a P-doped region 12 and an N-doped region 14. The substrate 10 is doped with the N- or P-type dopants with a dose of about $1 \times 10^{16}$ to about $1 \times 10^{21}$ ion/cm$^2$, for example.

A shallow trench isolation (STI) structure 16 provides separation between the P-doped region 12 and the N-doped region 14 at the device level. Conventional STI formation methodology may be employed to create the shallow trench isolation region 16.

A gate dielectric layer 18 is formed on the substrate 10. The gate dielectric layer 18 may consist of a gate oxide, for example. In certain embodiments of the invention, the gate dielectric layer 18 is ultra-thin, and may be between about 5 to about 30 Å, for example. Such a thin gate dielectric layer is readily susceptible to damage during a metal dry etch process, so that a silicide process has certain advantages. However, a fully silicided gate formation process can overstress the gate oxide.

A first silicon layer 20 is formed on the gate dielectric layer 18. The first silicon layer 20 may be deposited in a conventional manner. In certain preferred embodiments of the invention, the first silicon layer is relatively thin, between 10 to about 500 Å, for example. In certain particularly preferred embodiments, the thickness of the first silicon layer is between 50 to about 200 Å. In certain other particularly preferred embodiments, the thickness of the first silicon layer is less than about 50 Å. A relatively thin gate silicide thickness solves problems related to those created by fully silicided gate electrodes, including non-uniformity of silicidation and gate oxide reliability.

FIG. 2 depicts the structure of FIG. 1 following the formation of an etch stop layer 22 on the first silicon layer 20. The etch stop layer 22 may be an oxide layer, for example. It is desirable to form the etch stop layer 22 to be very thin, such as about 10 Å, for example. Any suitable method for forming such a thin layer of oxide or other etch stop material may be employed. For example, an oxidation process at 600 to 1000° C. may be used to form the etch stop layer 22.

Following the formation of the etch stop layer 22, a second layer of silicon 24 is formed by conventional methodologies on the etch stop layer 22. The second silicon layer 24 may be between about 700 to about 2000 Å, for example, and in certain embodiments, is about 1000 Å thick.

Figure 4:
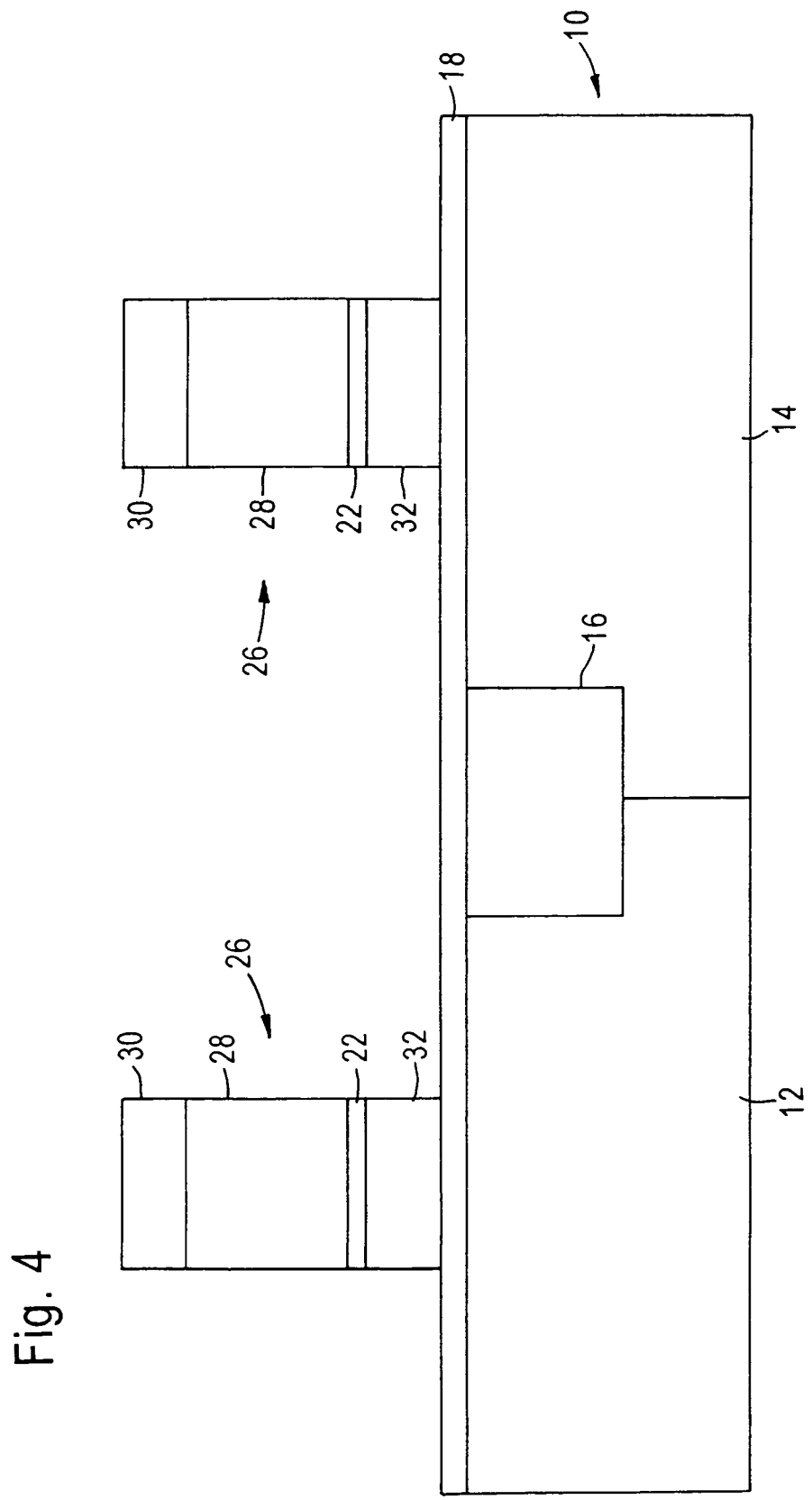
FIG. 4 shows the structure of FIG. 3 following the formation of a hard mask, lithography and anisotropic etching to form silicon stacks in accordance with embodiments of the present invention.
Figure 5:
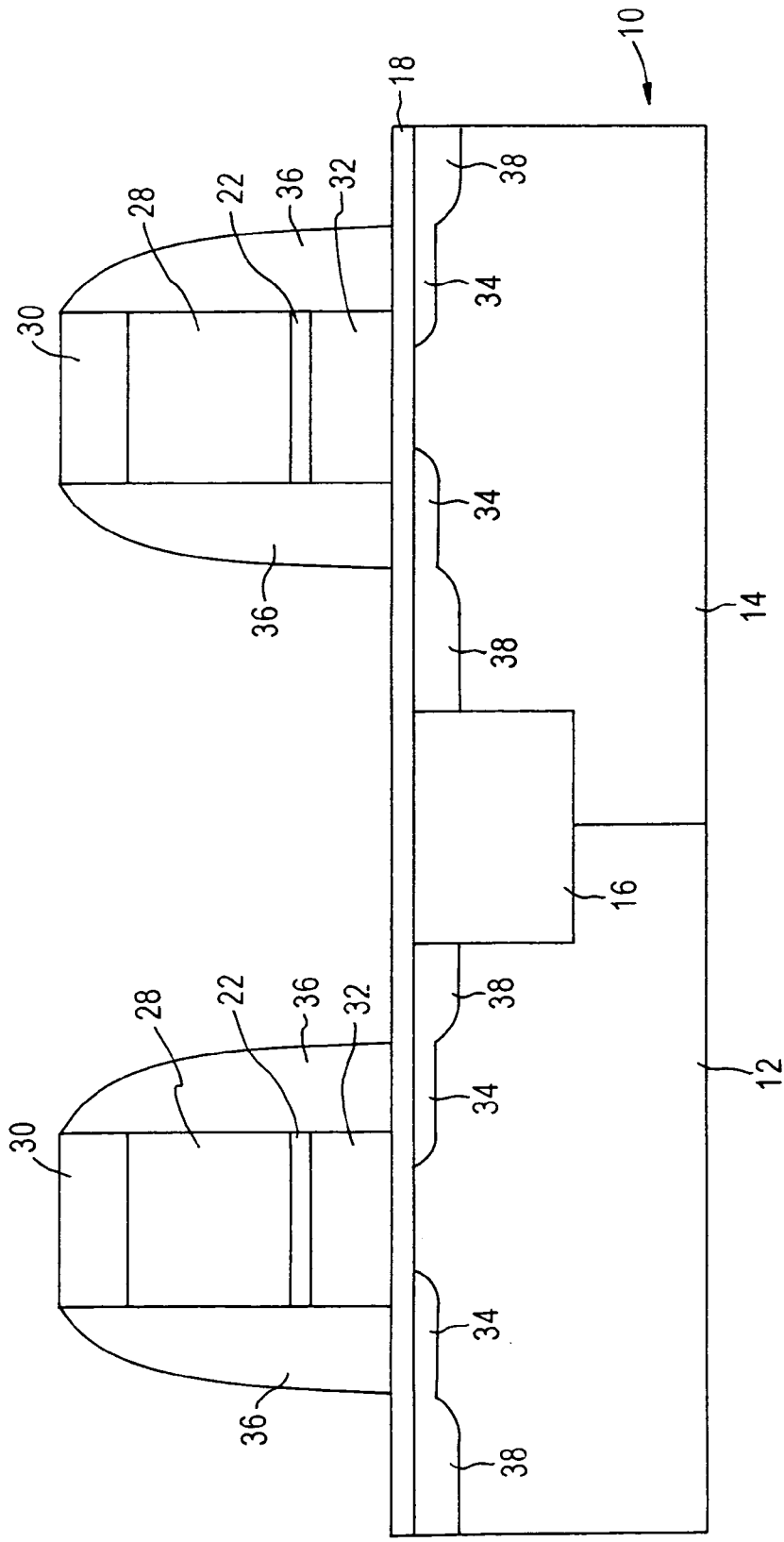
FIG. 5 depicts the structure of FIG. 4 after the formation of source/drain extensions, sidewall spacers, and source/drain regions, in accordance with embodiments of the present invention.

FIG. 4 depicts the structure of FIG. 3 after a hard mask layer has been deposited on the second silicon layer 24, followed by etching steps to form silicon stacks 26. Each of the silicon stacks 26 has a hard mask 30 formed on the upper portion 28 of the silicon stack 26. The etching creates silicon regions 32 in each of the silicon stacks 26. The hard mask 30 may be any suitable material, such as silicon nitride, silicon oxide, etc. A conventional anisotropic etching technique, such as reactive ion etching, is employed to etch down to the gate dielectric layer 18.

Following the formation of the silicon stacks 26, a source/drain extension implantation process is performed to create source/drain extensions 34. Conventional masking and doping techniques are performed to appropriately dope the NMOS devices and PMOS devices separately with a suitable dose of dopants. Following the creation of the source/ drain extensions 34, sidewall spacers 36 are created on the sidewalls of the silicon stack 26 by conventional techniques, such as deposition of a spacer material and etching. Subsequent to the formation of the sidewall spacers 36, appropriate masking and implantation techniques are employed to create source/drain regions 38 in the NMOS devices and the PMOS devices, respectively.

Figure 6:
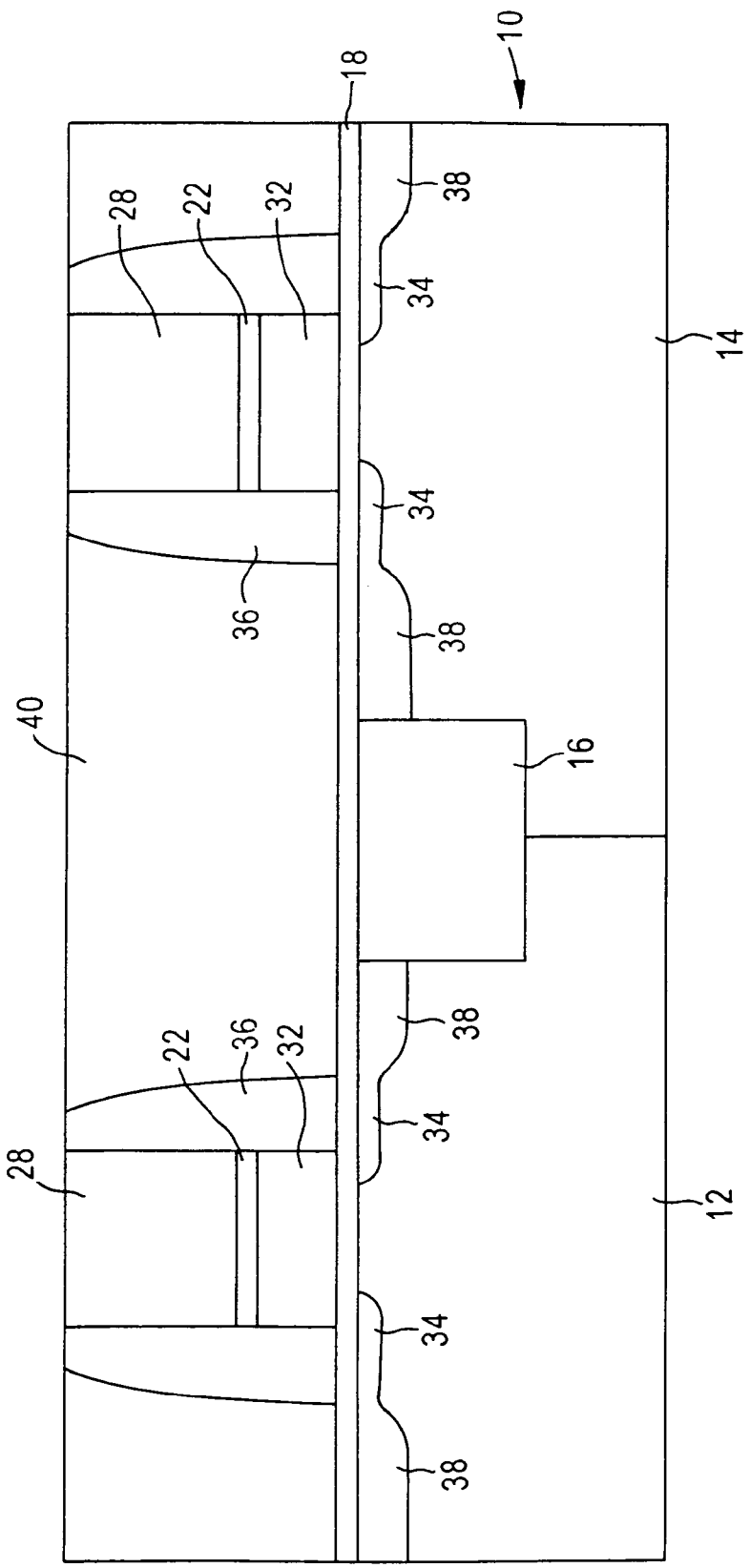
FIG. 6 shows the structure of FIG. 5 following the deposition of a dielectric layer and the planarization of the dielectric layer in removal of the hard mask in accordance with embodiments of the present invention.

In FIG. 6, a dielectric layer 40 has been deposited and planarized. The dielectric layer 40 may be of any conventional suitable dielectric material, such as a low k dielectric, an oxide, etc. The dielectric layer 40 may be deposited by any suitable methodology, such as chemical vapor deposition (CVD), etc. The planarization, in certain embodiments, is chemical-mechanical polishing, for example.

Figure 7:
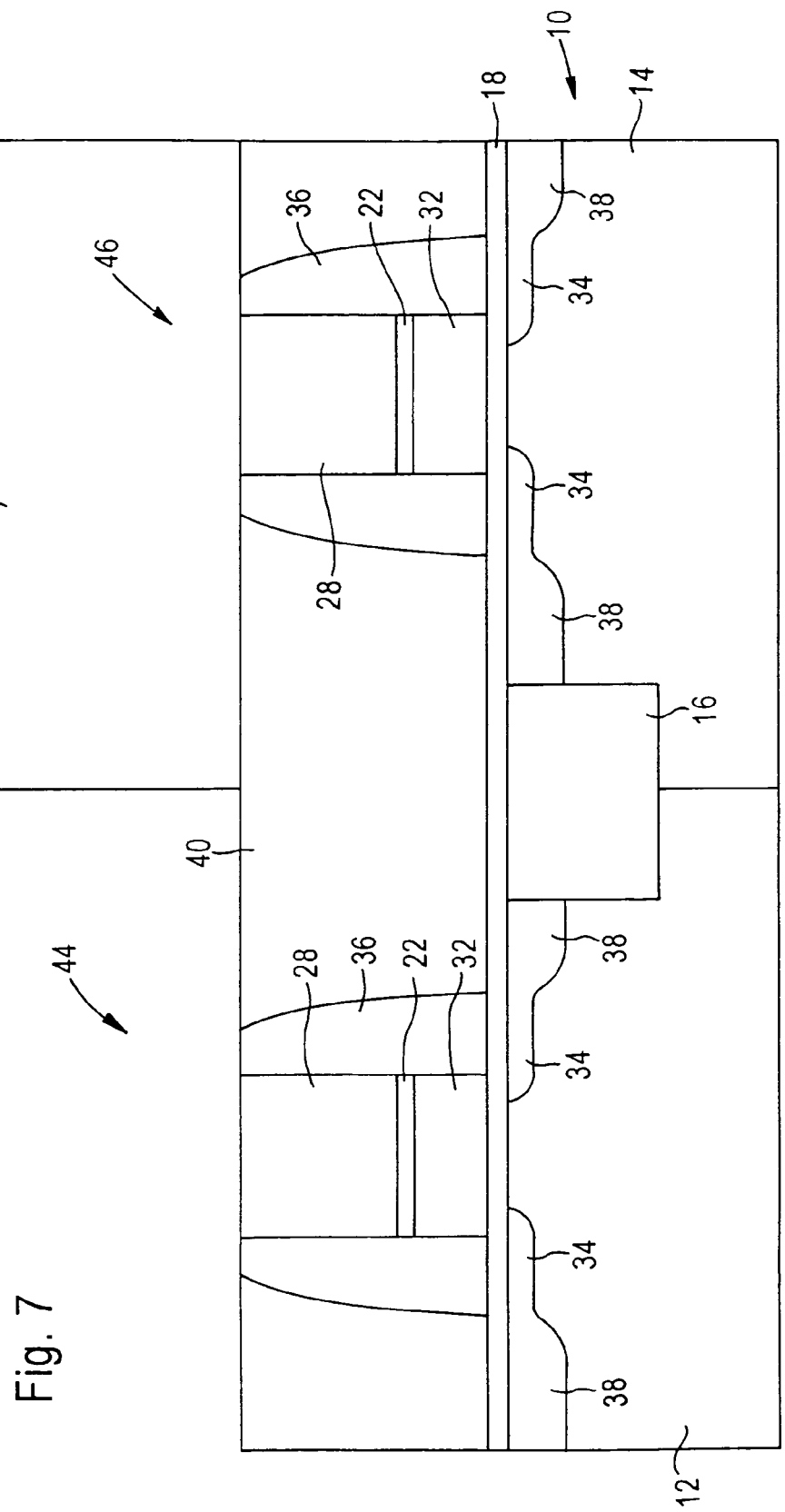
FIG. 7 depicts the structure of FIG. 6 following a lithography step to mask the PMOS devices in accordance with embodiments of the present invention.
Figure 8:
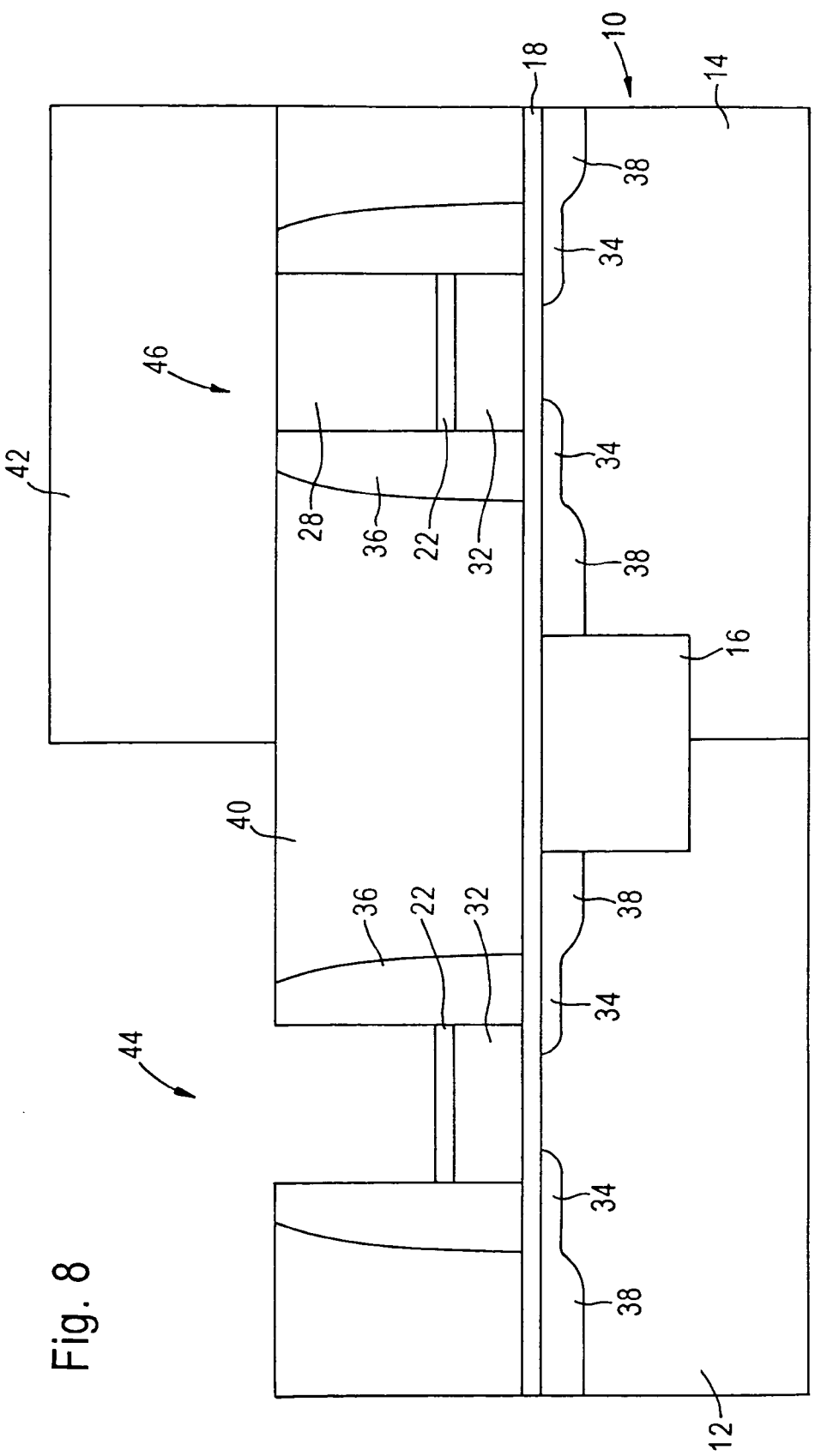
FIG. 8 shows the structure of FIG. 7 following an etching of the upper portion of the silicon stack of the NMOS devices in accordance with embodiments of the present invention.

A lithography and masking step is then performed, as depicted in FIG. 7, in which photoresist 42 masks the PMOS devices 46 and exposes the NMOS devices 44. Following the lithography step, a polysilicon etch process is performed that is very selective to oxide. An anisotropic etch, such as a reactive ion etch, can be employed. Suitable etchants include chlorine and $HBrO_2$, or $SF_6$, for example. As seen in FIG. 8, the upper portion 28 of the silicon stack 26 is removed by this etch process. The etch stops on the etch stop layer 22 reliably. This preserves the silicon region 32.

Figure 9:
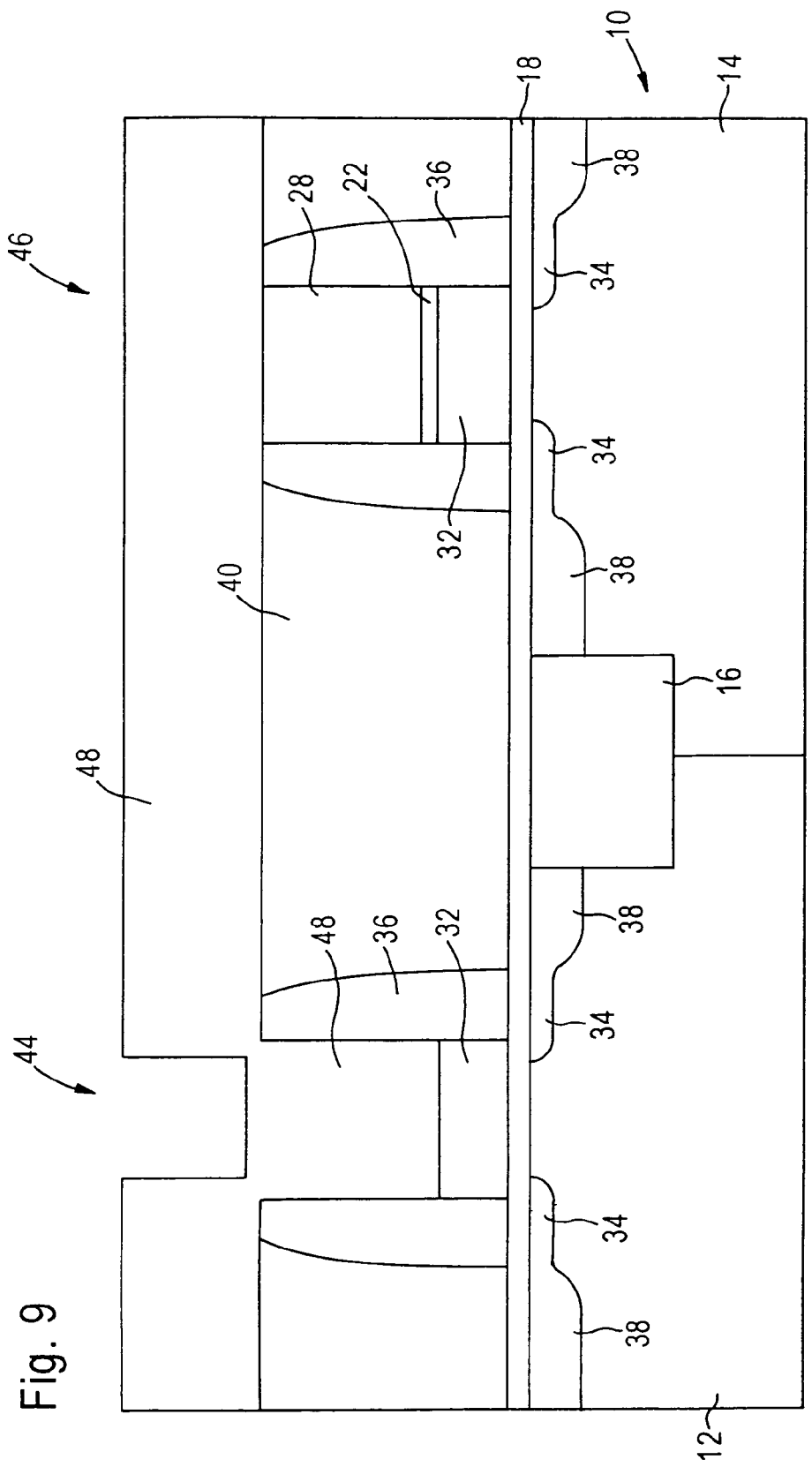
FIG. 9 depicts the structure of FIG. 8 after the removal of the etch stop layer and deposition of a first metal in accordance with embodiments of the present invention.

As seen in FIG. 9, first metal 48 is deposited to a thickness that assures complete filling of space left by the etching of the upper portion 28 of the silicide stack 26. Prior to the depositing of the first metal 48, however, the etch stop layer 22 is removed. When the etch stop layer 22 is an oxide, for example, a buffered oxide etch is performed to remove the etch stop layer 22. This etch is a short time wet etch, for example, to remove the very thin etch stop layer 22 without damaging the surrounding sidewall spacer 36. In certain embodiments of the invention, therefore, the first metal 48 is deposited to a thickness of at least 1000 Å to assure complete filling of the space previously occupied by the upper portion 28 of the silicon stack 26.

In preferred embodiments, the first metal 48 is a metal or metal alloy that when reacted with silicon, forms a silicide with a work function close to the conduction band of silicon. This is defined as being within +/−0.2V of the conduction band of silicon. For the NMOS devices 44, one suitable metal is tantalum. However, the invention is not limited to tantalum, but may include other metals whose silicides are close to the conduction band of silicon.

Figure 10:
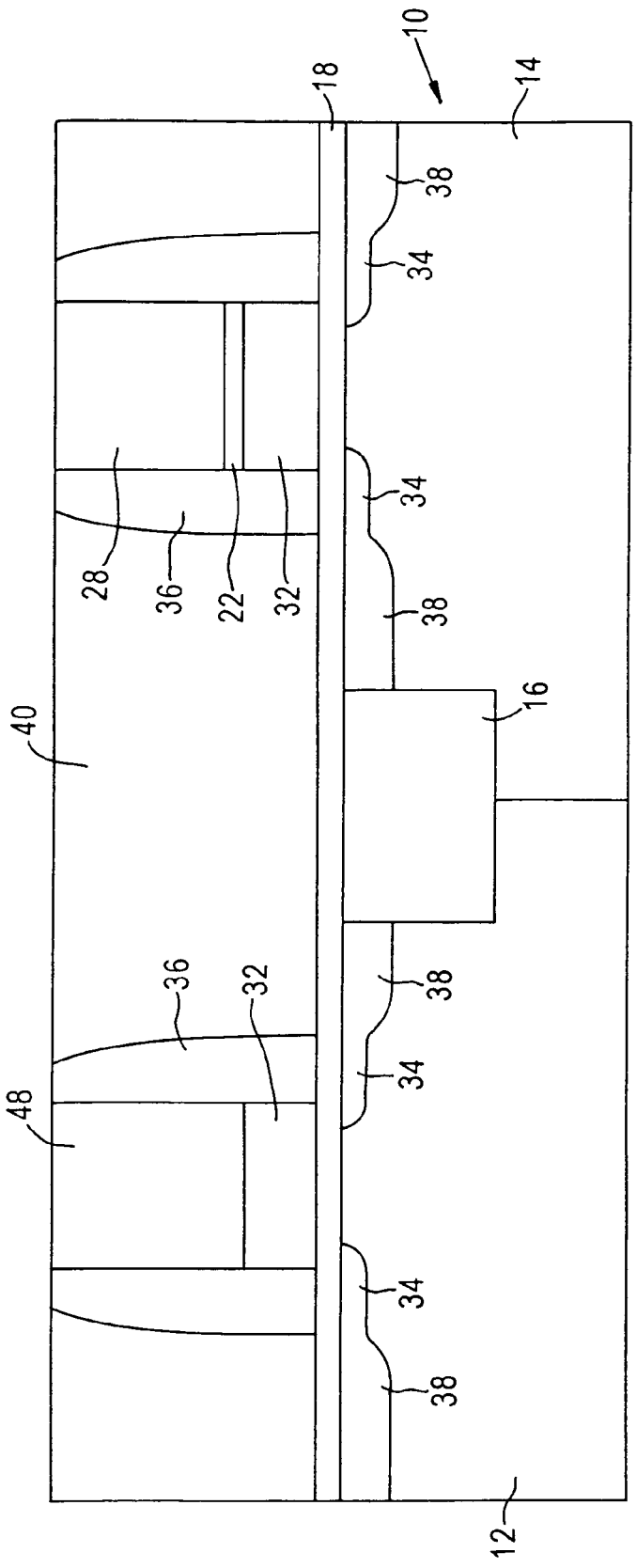
FIG. 10 shows the structure of FIG. 9 after a planarization process in accordance with embodiments of the present invention.
Figure 11:
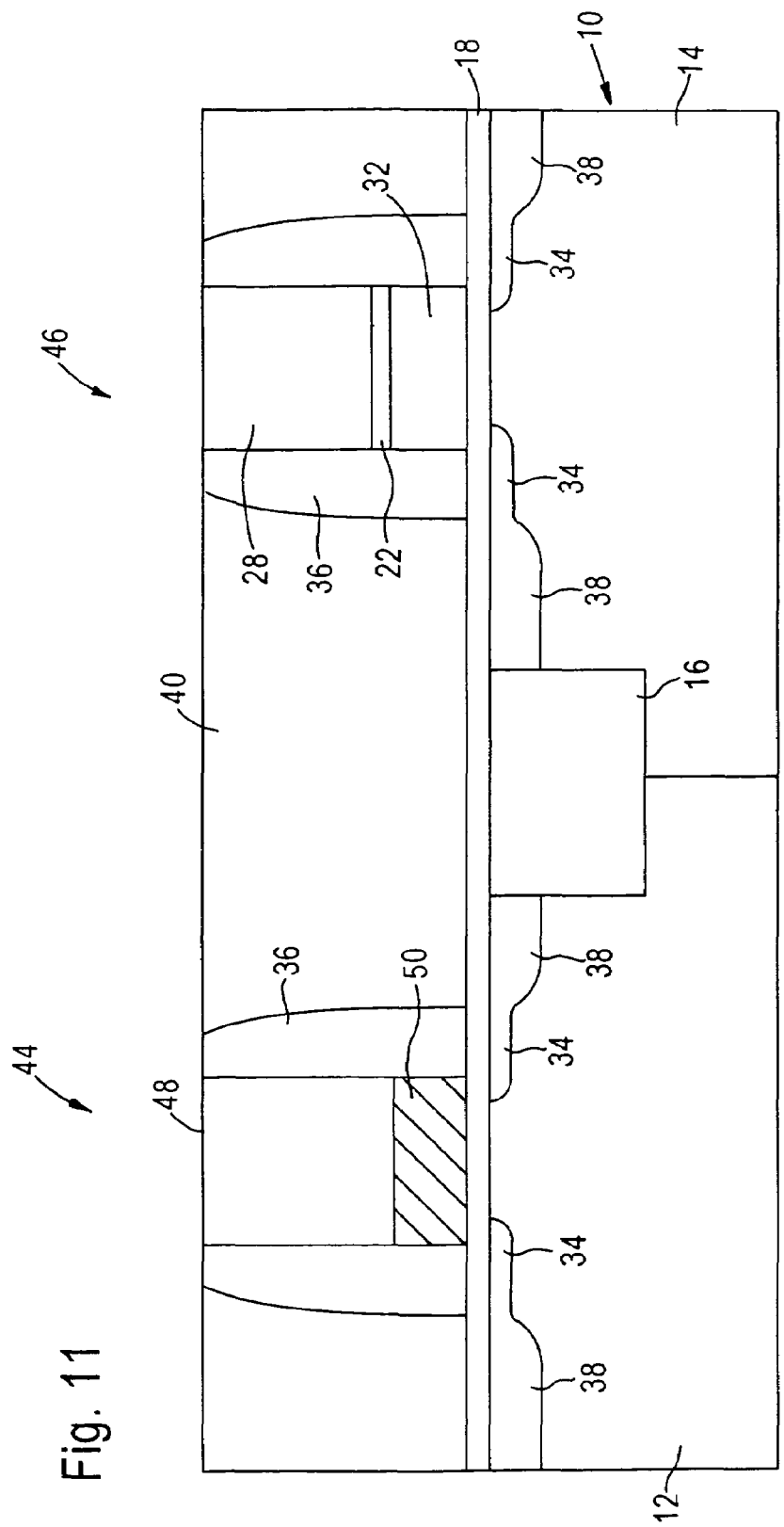
FIG. 11 depicts the structure of FIG. 10 following an annealing step to form a first silicide region in the NMOS devices in accordance with embodiments of the present invention.

FIG. 10 depicts the structure of FIG. 9 following the removal of the excess first metal 48, performed by a metal CMP process. The first metal 48 is removed until the dielectric layer 40 is reached.

Following the metal CMP process, an annealing process, such as rapid thermal annealing, is employed to form the first silicide region 50 in each of the NMOS devices 44. A suitable temperature range is employed, depending upon the type of metal or metal alloy used as the first metal 48. Such processing conditions are known to those of ordinary skill in the art.

Figure 12:
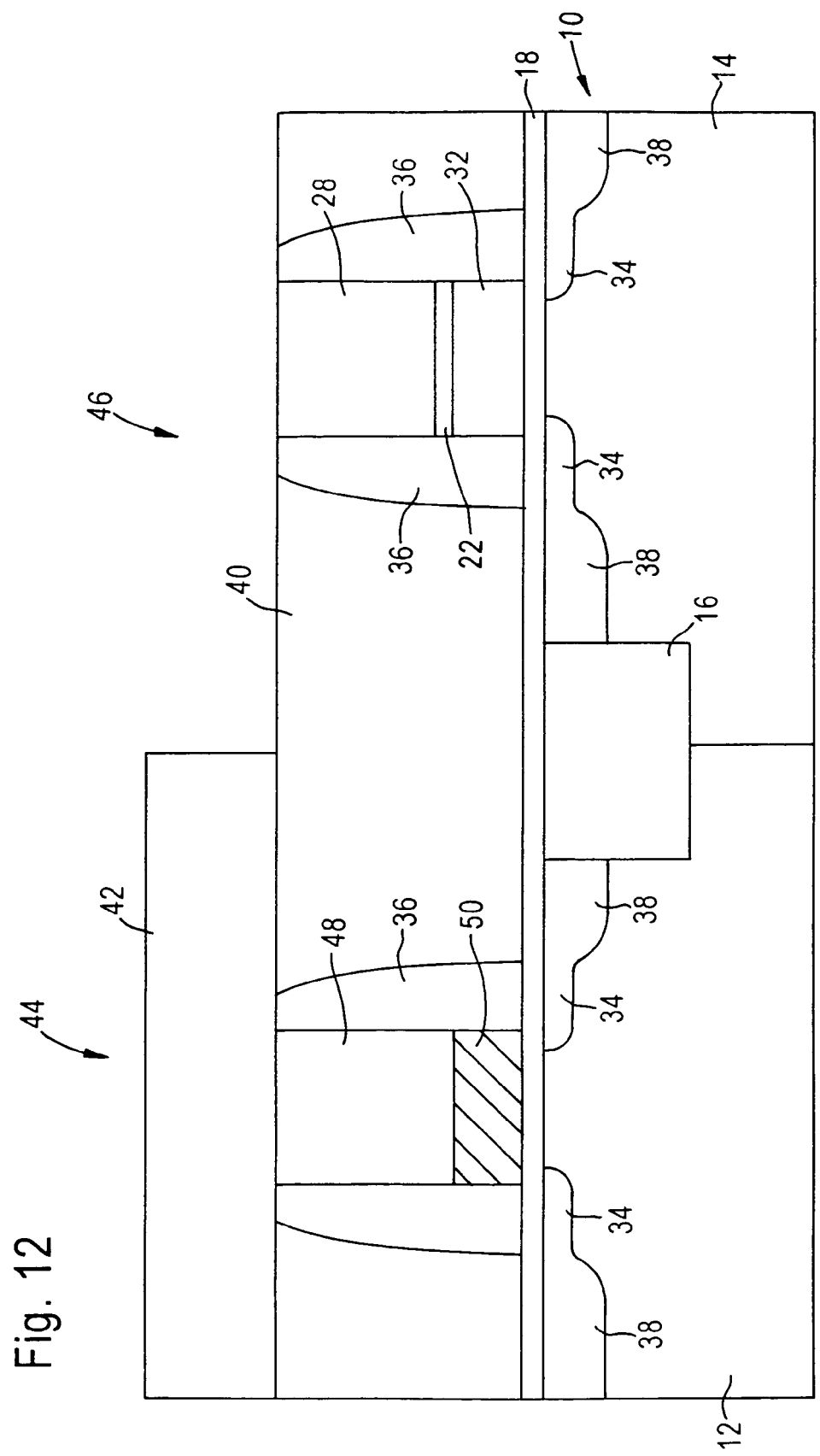
FIG. 12 shows the structure of FIG. 11 following a lithography step to mask the NMOS devices in accordance with embodiments of the present invention.
Figure 13:
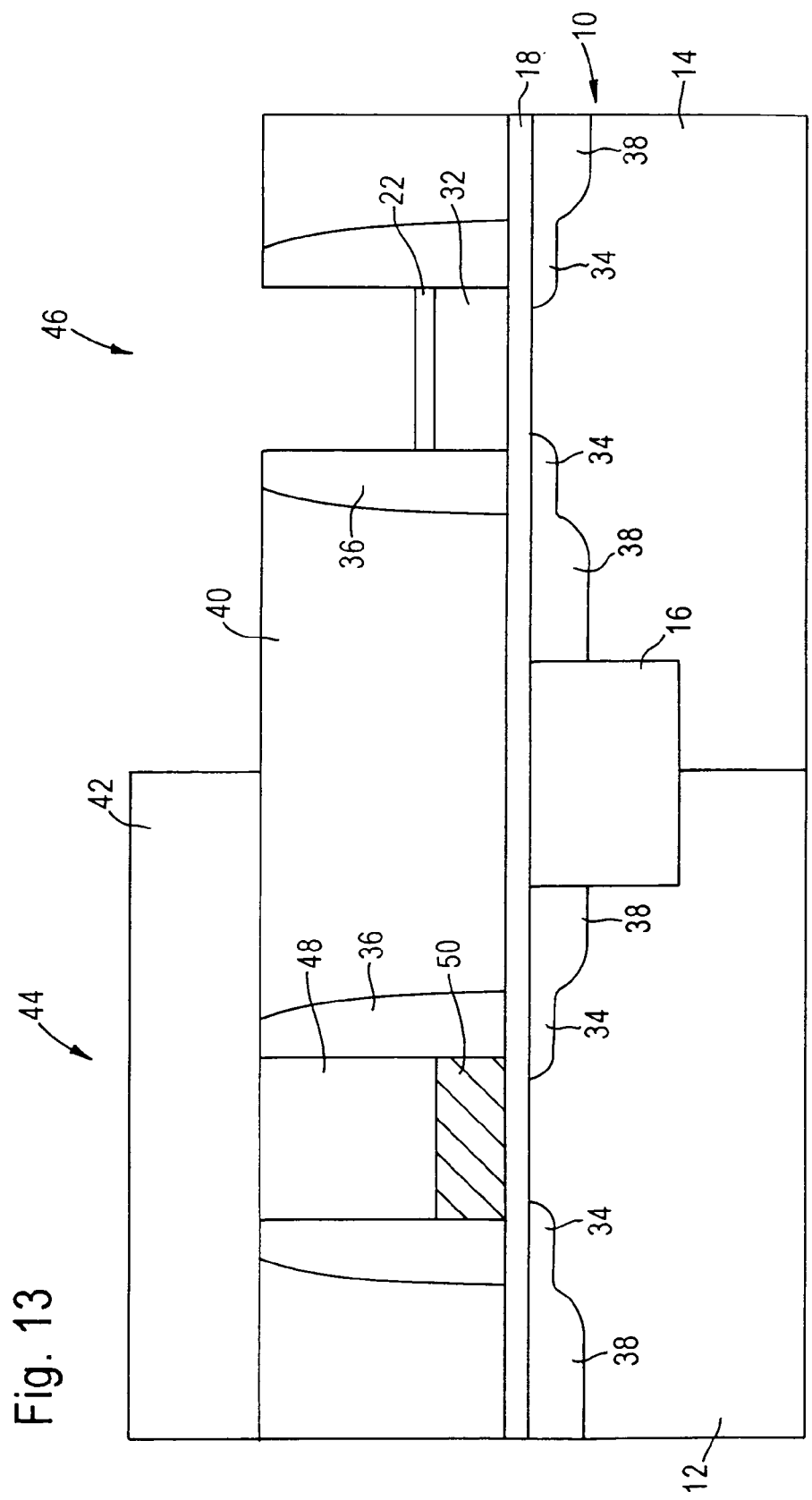
FIG. 13 depicts the structure of FIG. 12 after an etching step is performed to remove the upper portion of the silicon stacks in the PMOS devices, in accordance with embodiments of the present invention.

An analogous process is performed in FIGS. 12–16 to create the second silicide regions in the PMOS devices. Hence, FIG. 12 depicts a lithography step in which the NMOS devices 44 are masked and the PMOS devices 46 are exposed. An etching process removes the upper portion 28 of the silicon stack 26 in each of the PMOS devices 46, as depicted in FIG. 13.

Figure 14:
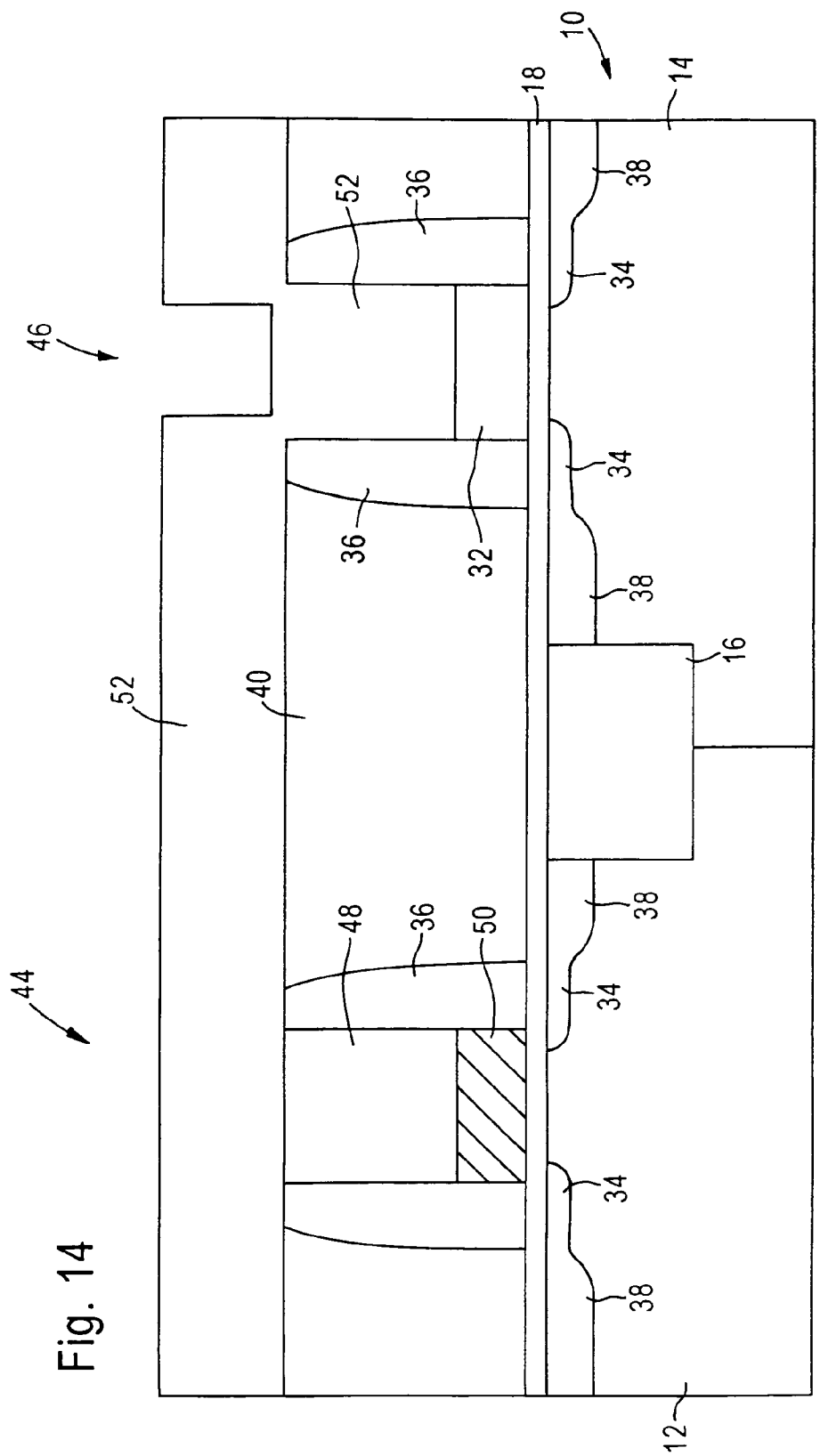
FIG. 14 depicts the structure of FIG. 13 after removal of the etch stop layer in the PMOS devices and deposition of a second metal in accordance with embodiments of the present invention.
Figure 15:
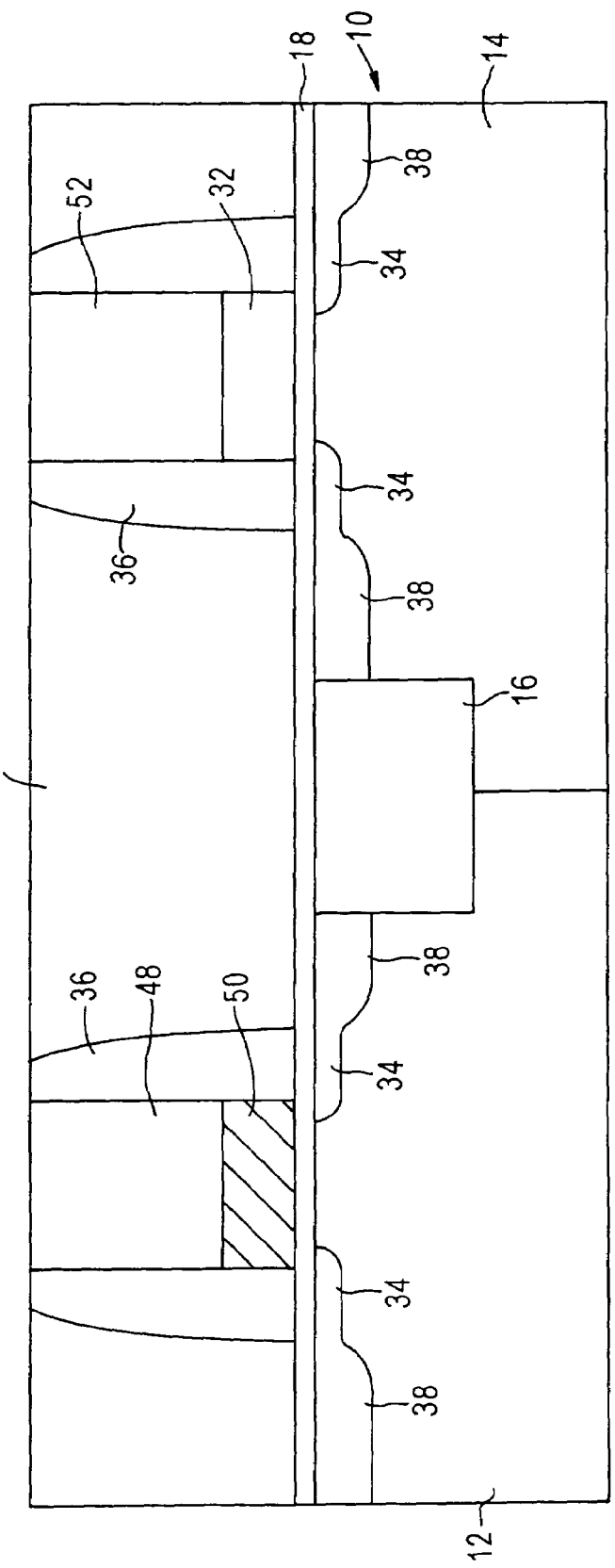
FIG. 15 depicts the structure of FIG. 14 after a planarization process in accordance with embodiments of the present invention.

As seen in FIG. 14, a second metal 52 is deposited on the dielectric layer 40 and within the space previously occupied by the upper portion 28 of the silicon stack 26. However, the second metal 52 consists of a metal or metal alloy that forms a silicide with a work function that is close to the valence band of silicon. In other words, the work function of the silicide is within +/−0.2V of the valence band of silicon. Exemplary materials may include ruthenium, rhenium, or cobalt, for example. Other types of materials may be employed as a second metal 52 without departing from the scope of the present invention. However, such materials should form silicides with a work function that is close to the valence band of silicon in order to achieve the desired dual work functions of the CMOS arrangement.

Figure 16:
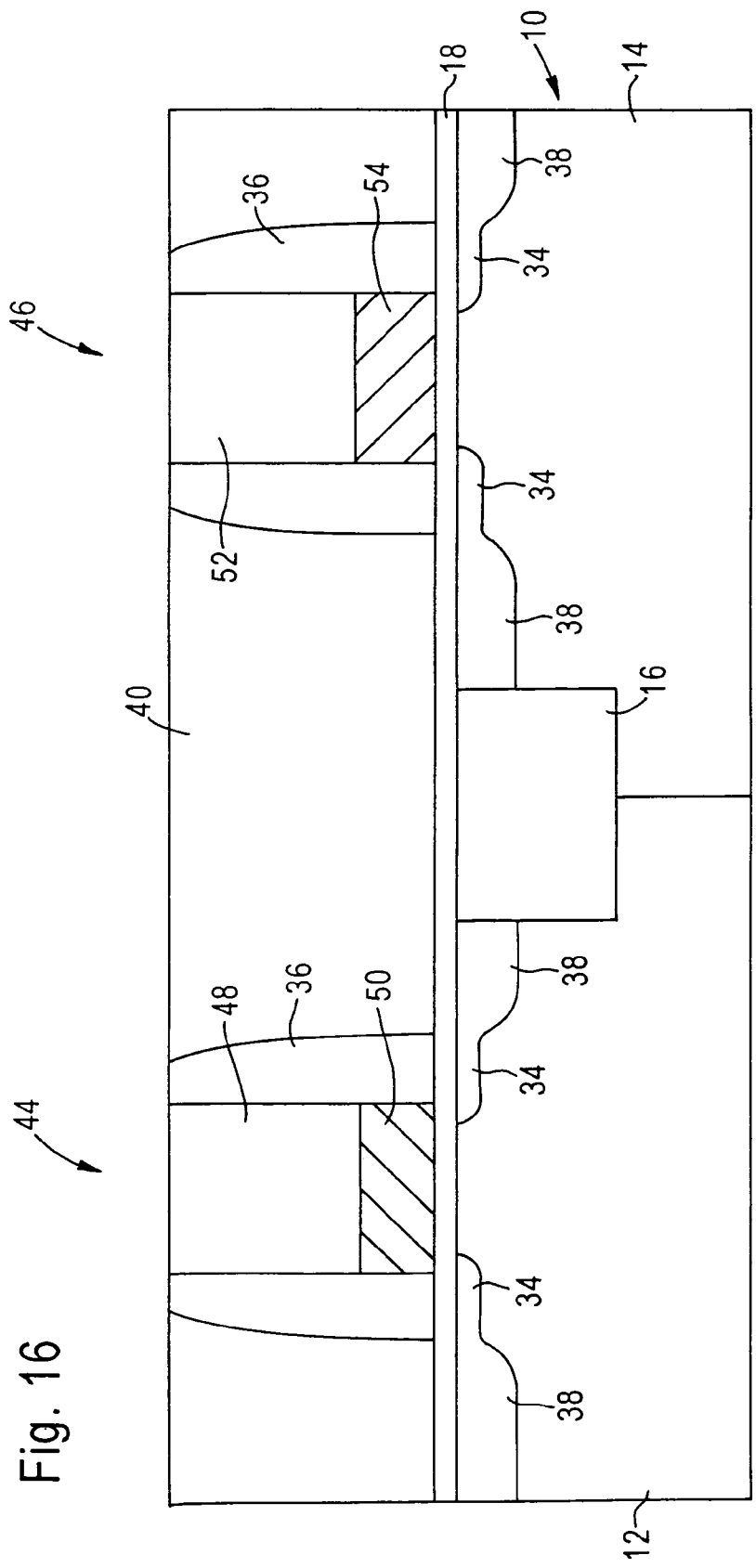
FIG. 16 depicts the structure of FIG. 15 following an annealing step to form the second silicide regions in accordance with embodiments of the present invention.

In FIG. 16, an appropriate annealing process is performed to form the second silicide regions 54 in the PMOS devices 46. A suitable temperature range for the annealing process is selected depending upon the metal forming the second metal 52.

As seen in FIG. 16, the NMOS devices have a first silicide region 50 consisting of a first silicide having a work function within +/−0.2V of the conduction band of silicon. The CMOS arrangement also has PMOS devices with second silicide regions that consist of a second silicide having a work function within +/−0.2V of the valence band of silicon. The work functions of gate electrodes of the NMOS and PMOS devices 44, 46 are thus tunable by employing different kinds of metals or metal alloys to form the metal silicides. This allows the gate silicide thickness to be reduced to below 50 Å, in certain examples, and between 50 Å to 100 Å, in certain other examples, and therefore solves many of the problems associated with fully silicided gates, such as non-uniformity in silicidation, and gate oxide reliability.

Figure 17:
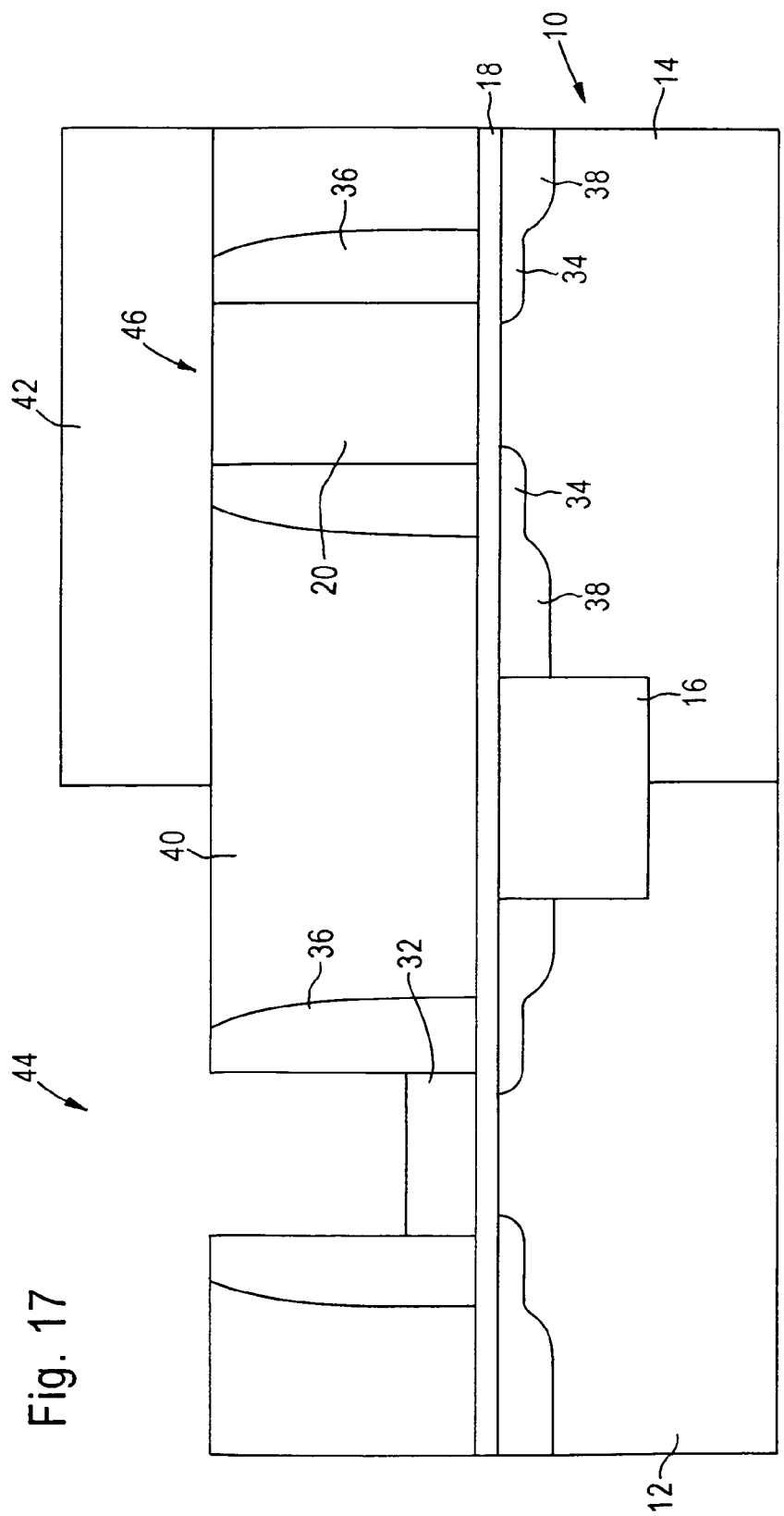
FIG. 17 depicts an alternate embodiment of the present invention during one phase of manufacture.
Figure 18:
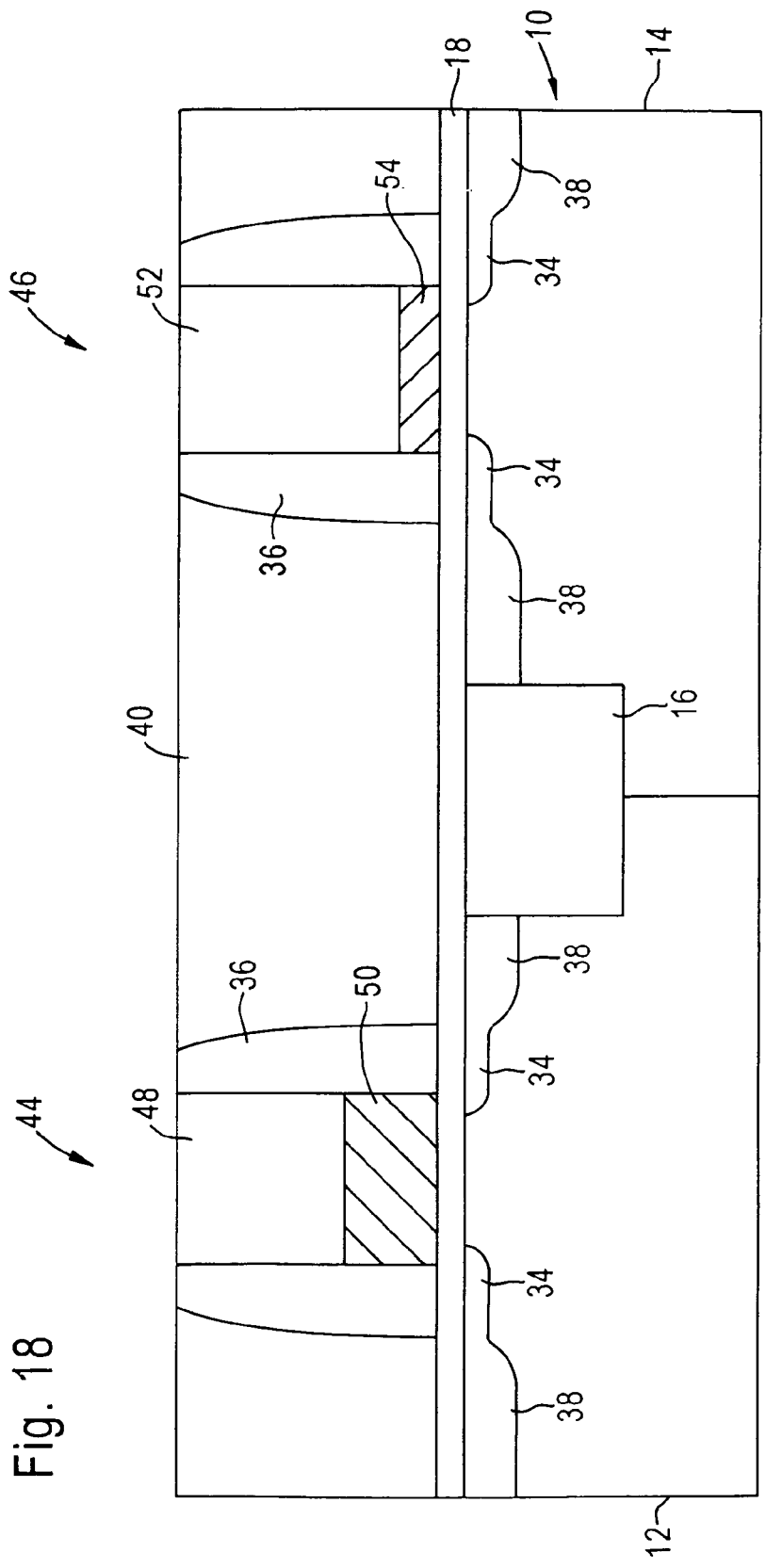
FIG. 18 depicts the alternate embodiment of FIG. 17 following formation of the first and second silicide regions in accordance with the alternate embodiments of the present invention.

FIGS. 17 and 18 depict certain steps in alternate embodiments of the present invention. In these embodiments, the etch stop layer 22 is not employed. Instead, the silicon stack 26 is recessed by a controlled wet or dry etching to substantially reduce the polysilicon thickness of the silicon stack 26 prior to silicidation. In FIG. 17, the PMOS device 46 is masked and the silicon stack 26 of the NMOS device is etched. A similar process occurs to etch the silicon stack 26 in the PMOS devices 46. In certain embodiments of the invention, however, the thicknesses of the remaining silicon of the silicon stacks 26 are carefully controlled to be a desired thickness. The thickness of a thin polysilicon affects the phases of the silicide regions that are formed, which exhibit different conductivities. In this manner, the work function of the devices can be adjusted. In such an embodiment, the same metal may be employed, or different metals may be employed, to form the first and second silicide regions 50, 54, respectively. This is because the thickness of the silicon regions will control the phases of the silicides that are ultimately formed. For example, certain type devices may be provided with a gate electrode having a higher resistivity phase silicide, such as CoSi, and other type devices provided with a gate electrode having a lower resistivity phase silicide, such as $CoSi_2$. One of ordinary skill in the art will set the annealing parameters, such as time and temperature, to form the first and second silicide regions 50, 54 to have the desired silicide phases and therefore work functions, as a function of the thicknesses of the silicon regions and the metals employed in the first and second metals.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming a dual metal CMOS arrangement, comprising the steps:
    forming silicon regions on a gate dielectric layer to form gate electrodes in NMOS device regions and in PMOS device regions;
    depositing a first metal or metal alloy on the silicon regions in the NMOS device regions and a second metal or metal alloy on the silicon regions in the PMOS device regions;
    annealing to react the first metal or metal alloy with the silicon regions in the NMOS device regions to thereby form first silicide regions and first metal or metal alloy regions on the first silicide regions and to react the second metal or metal alloy with the silicon regions in the PMOS device regions to thereby form second silicide regions and second metal or metal alloy regions on the second silicide regions; and
    wherein the first silicide regions have a work function within +/−0.2V of the conduction band of silicon, and the second silicide regions have a work function that is within +/−0.2V of the valence band of silicon.

2. The method of claim 1, wherein the step of forming silicon regions includes:
    depositing silicon on a gate dielectric layer;
    etching the silicon to form silicon stacks; and
    partially etching the silicon stacks to remove only an upper portion of the silicon stacks and thereby form the silicon regions.

3. The method of claim 2, wherein the step of partially etching is a controlled timed etching of the silicon stack within an etch step.

4. The method of claim 2, wherein the step of depositing silicon includes: depositing a first silicon layer on the gate dielectric layer; forming an etch stop layer on the first silicon layer; and forming a second silicon layer on the etch stop layer.

5. The method of claim 4, wherein the step of partially etching includes: etching the second silicon layer and stopping on the etch stop layer; and removing the etch stop layer.

6. The method of claim 1, further comprising controlling the work function of the first and second silicide regions by controlling the phases of the first and second silicide regions.

7. The method of claim 6, wherein the step of controlling the phases of the first and second silicide regions includes controlling the thickness of the silicon regions.

8. The method of claim 1, wherein the first metal or metal alloy is tantalum.

9. The method of claim 1, wherein the second metal or metal alloy is one of ruthenium, rhenium or cobalt.

10. The method of claim 1, wherein the first metal or metal alloy is tantalum, and the second metal or metal alloy is one of ruthenium, rhenium or cobalt.

* * * * *